United States Patent
Knapp et al.

(10) Patent No.: US 10,135,458 B2
(45) Date of Patent: Nov. 20, 2018

(54) METHOD FOR PROCESSING A MEASURED-VALUE SIGNAL REPRESENTING A VALUE DETERMINED IN ANALOG FORM FOR THE OUTPUT CURRENT OF A CONVERTER AND DEVICE FOR CARRYING OUT THE METHOD

(71) Applicant: SEW-EURODRIVE GMBH & CO. KG, Bruchsal (DE)

(72) Inventors: Thomas Knapp, Muggensturm (DE); Hans Juergen Kollar, Bruchsal (DE); Wolfgang Hammel, Bruchsal (DE); Ulrich Neumayer, Forst (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 15/174,329

(22) Filed: Jun. 6, 2016

(65) Prior Publication Data
US 2018/0123610 A1    May 3, 2018

Related U.S. Application Data

(63) Continuation of application No. 13/392,706, filed as application No. PCT/EP2010/004903 on Aug. 11, 2010, now Pat. No. 9,362,944.

(30) Foreign Application Priority Data

Aug. 26, 2009  (DE) .................. 10 2009 038 595
Jul. 26, 2010  (DE) .................. 10 2010 032 296

(51) Int. Cl.
*H03M 3/00*  (2006.01)
*H03M 1/64*  (2006.01)

(52) U.S. Cl.
CPC ............ *H03M 3/462* (2013.01); *H03M 1/645* (2013.01)

(58) Field of Classification Search
CPC ....................................................... H03M 3/462
USPC .......................... 341/118, 157, 143, 155, 144
See application file for complete search history.

(56) References Cited

U.S. PATENT DOCUMENTS

| | | | |
|---|---|---|---|
| 4,872,129 | A | 10/1989 | Pfeifer et al. |
| 6,311,201 | B1 | 10/2001 | Albright |
| 7,138,935 | B1 | 11/2006 | Damphousse et al. |
| 7,176,819 | B1 | 2/2007 | Swerlein et al. |

(Continued)

FOREIGN PATENT DOCUMENTS

| | | |
|---|---|---|
| CN | 101317331 A | 12/2008 |
| DE | 102005005024 A1 | 8/2006 |

(Continued)

OTHER PUBLICATIONS

"Motor Control Current Shunt 1-Bit, 10MHz, 2nd-Order, Delta-Sigma Modulator", Texas Instruments Incorporated, ADS1202 data sheet, Jul. 1, 2004. (retreived from http://focus.ti.com/lit/ds/symlink/ads1202.pdf).

(Continued)

*Primary Examiner* — Peguy Jean Pierre
(74) *Attorney, Agent, or Firm* — Hunton Andrews Kurth LLP

(57) ABSTRACT

A method for processing a measured-value signal representing a value, determined in analog form, for the output current of a converter, and device for carrying out the method, the measured-value signals acquired by a sensor, especially including a shunt resistor, being supplied to a respective processing channel that has at least one delta-sigma modulator.

17 Claims, 3 Drawing Sheets

(56) References Cited

U.S. PATENT DOCUMENTS 7,196,643 B2   3/2007   Ohnhaeuser et al.
7,548,825 B2   6/2009   Bayerer et al.

FOREIGN PATENT DOCUMENTS

DE   102006001874 A1   7/2007
EP        0320517 A1   6/1989
EP        1916771 A1   4/2008
GB        2431475 A    4/2007

OTHER PUBLICATIONS

International Search Report, dated Jan. 19, 2011, in International Application No. PCT/EP2010/004903. (English-language translation).

International Preliminary Report on Patentability, dated Mar. 6, 2012, in International Application No. PCT/EP2010/004903. English-language translation).

METHOD FOR PROCESSING A
MEASURED-VALUE SIGNAL
REPRESENTING A VALUE DETERMINED IN
ANALOG FORM FOR THE OUTPUT
CURRENT OF A CONVERTER AND DEVICE
FOR CARRYING OUT THE METHOD

CROSS-REFERENCE TO RELATED
APPLICATIONS

The present application is a continuation of U.S. patent application Ser. No. 13/392,706, now U.S. Pat. No. 9,362,944, which is the national stage of PCT International Patent Application No. PCT/EP2010/004903, filed on Aug. 11, 2010, which claims priority to German Patent Application No. 10 2009 038 595.9, filed on Aug. 26, 2009 and to German Patent Application No. 10 2010 032 296.2, filed on Jul. 26, 2010, each of which is expressly incorporated herein in its entirety by reference thereto.

FIELD OF THE INVENTION

The present invention relates to a method for processing a measured-value signal representing a value, determined in analog form, for the output current of a converter, and a device for carrying out the method.

BACKGROUND INFORMATION

German Patent No. 10 2005 005 024 describes a method in which the analog carrier-voltage signal values, generated by a resolver used as an angle sensor, whose characteristic is substantially sinusoidal and whose amplitude corresponds to the sine value or the cosine value of the angular value to be detected, are converted into a digital data stream. A delta-sigma modulator is used for this analog-to-digital conversion, downstream from which is a $Sinc^3$-filter which acts as a low-pass filter. The reason is that the three accumulators in FIG. 5 of that document, acting in integrating fashion, are operated with a faster clock frequency $F_S$ than the three differentiators operated with the slower clock frequency $F_D$. At the output of the filter, a multibit data stream emerges which, according to FIG. 2 there, is supplied to a decimation filter OSR2 that, in essence, corresponds to a summation, thus, averaging. Consequently, the measured value is available in digital form at its output.

Synchronization of the multibit data stream to other signal patterns is possible only with difficulty, or not at all. The measuring duration, i.e., the beginning and end of the measuring interval, is adjustable only with a long time duration $T_D$, since the signal at the output of the third integrator with $f_D$ is subsampled. Consequently, as of this point in the signal chain, all signals are only available with the rough time quantization $T_D$. Therefore, the beginning and end, or the measuring duration over which the decimation filter OSR2 measures, can only be specified in integral multiples of $T_D$. However, in industrial applications, there is often the need to synchronize secondary control loops with higher-level control loops. These different control loops may also be realized spatially separate from each other, the time referencing then being transmitted via a field bus system. Therefore, the task is to synchronize the secondary control loop with a clock pulse predefined from outside. To that end, usually the period duration of the sampling interval of the secondary control loops is altered slightly, so as to achieve this synchronization. To permit performing the synchronization with high quality, it is necessary to be able to change the period duration of the secondary control loop in the smallest steps possible. A temporally rough quantization of the smallest possible period-duration modification thus limits the achievable quality of the synchronization control. Since within a control loop, the measured-value acquisition is also operated in synchronized fashion, a rough quantization of the measuring instants or the measuring duration likewise leads to a limitation in the synchronization control.

SUMMARY

Example embodiments of the present invention provide a method of measurement in which it is possible to specify the beginning and end of the measuring interval or the measuring duration with a high time resolution. This time quantization amounts to $T_S$, which in the case of DE 10 2005 005 024, amounts to $T_D$. However, in order to achieve sufficient filtering action of the low-pass filter, $T_D$ must be selected to be substantially greater than $T_S$, the limitations indicated in the related art described thereby resulting.

EP 0 320 517 describes a digital decimation filter in which a last differentiator has k time-delay elements which delay by the period duration of the output-data clock pulse, thus, decimation clock pulse dt. Therefore, only integral multiples of the decimation clock pulse dt are thus able to be realized as delay there. However, the last of the integrators in FIG. 1 of EP 0 320 517 according to claim 1 there is equipped with a reset device which therefore acts like a differentiator (EP 0 320 517, claim 1, line 56).

Example embodiments of the present invention further provide the analog-to-digital conversion in the case of a measured-value acquisition.

Among features of example embodiments of the present invention with regard to the method are that it is used to process a measured-value signal representing a value, determined in analog form, for the output current of a converter, the measured-value signals acquired by a sensor, especially including a shunt resistor, being supplied to a respective processing channel that has at least one delta-sigma modulator.

The advantage in this context is that the measured value is acquired in analog form, and this analog value is able to be supplied to the delta-sigma modulator, and thus is convertible into a digital representation. It is especially advantageous that the data stream emerging from the modulator is a one-bit data stream, and thus may easily be passed on to an evaluation unit such as signal electronics having a digital filter. In addition, a jitter problem is avoidable.

In example embodiments, the output data stream from the delta-sigma modulator is supplied to a digital filter, the output data stream being transmitted to the digital filter according to a Manchester code process, in particular, the filter being spatially separate from the delta-sigma modulator. The advantage in this case is that only one single-wire connection is necessary for the data transmission.

In example embodiments, a respective measured-value signal is supplied to a delta-signal modulator, which makes a bit stream, particularly a one-bit data stream, available on the output side. This offers the advantage that it is able to be transmitted especially easily. In particular, only a single galvanically isolating device, such as an inductive transformer, is required.

In example embodiments, digital data, especially a one-bit output data stream from the delta-sigma modulator, are transmitted as a simple one-bit binary signal, particularly without additional transmission of a clock signal and/or in the Manchester code. The advantage in this instance is that a single, differential, serial data channel is required for transmitting the data. Filtering out of the clock signal, and therefore also reconstruction of the one-bit output data stream from the modulator, is then made possible on the receive side.

In example embodiments, the output data stream from the delta-sigma modulator is supplied to at least one digital filter, especially to a filter spatially separate from the delta-sigma modulator. This is advantageous because a galvanically isolated transmission of the data stream from the modulator to the filter is feasible using simple arrangements.

In example embodiments, the measured-value signal is supplied to a delta-sigma modulator, which makes a bit stream, particularly a one-bit data stream, available on the output side, the bit stream being supplied to a first digital filter that converts the bit stream into a stream of digital intermediate words, thus, a multibit data stream, the first digital filter having a number n of serially disposed accumulators, particularly integrators, where n is an integer and is equal to or greater than 1, in particular, is equal to or greater than 2, the bit stream being clocked with a clock frequency $f_S$, thus with a clock period $T_S=1/f_S$, and therefore the stream of digital intermediate words being clocked, and therefore updated, with a clock frequency $f_S$, thus clock period $T_S=1/f_S$, the output signal of the first digital filter being supplied to a second digital filter, the second digital filter having the difference between a first and a second result data-word stream as output data-word stream, the first and second result data-word streams being determined from the intermediate data-word stream over a first and second time interval, the first and second time intervals being situated at a distance in time T1, the first result data-word stream being determined from the intermediate data-word stream as a time-discrete differential of the order (n−1), with time scale $T_D$, the second result data-word stream being determined from the intermediate data-word stream as a time-discrete differential of the order (n−1), with time scale $T_D$, the distance in time T1 being greater than time scale $T_D$, in particular, T1 being an integral multiple of clock period $T_S$.

Signal clock $T_U$ at the output of second digital filter is selectable differently depending on the example of application and the practical embodiment of the method. For instance, T1, $T_D$ or perhaps $T_S$ or any other integral multiple of $T_S$ are usable as signal clock $T_U$. In this connection, it is advantageous that $T_U$ may be selected as a multiple of $T_S$, and therefore is settable with high time resolution.

For example, the method may be utilized to sense the output current "i" of a converter which is operated with pulse-width modulation. In this case, for example, measuring duration T1 is intended to extend over one half PWM period duration. Consequently, T1 is able to be set very exactly with the high time resolution of $T_S$ according to the measuring duration desired. In addition, one measurement is to be carried out in each PWM period, thus, $T_U$ is specified according to PWM period duration $T_{PWM}$, independently of T1 This may likewise be done with the high time resolution of $T_S$. Even if, for instance, $T_{PWM}$ is not an integral multiple of $T_S$, the time deviation therefrom In specifying $T_U$ remains very slight owing to the use of the method described herein.

The advantage in this context is that an improved analog-to-digital conversion is practicable, in which a digital filter is now usable that, on one hand, has a low-pass function, and on the other hand, makes the data stream available in such a way that the digital information with regard to the signal-voltage value at the input of the delta-sigma modulator is available with very high accuracy. It is especially advantageous that the series arrangement of accumulators is not followed by any differentiators with subsequent averaging, but rather that only a few intermediate data words are linked, in each case at a suitable distance in time, with the aid of simple operations such as subtraction and addition or multiplication by the factor 2, or the like. Thus, a highly precise analog-to-digital conversion is feasible with low expenditure. In addition, even given a realization in hardware, a change of distances in time $T_D$ is practicable without special expenditure.

A further advantage is that no reset devices have to be used in the case of the accumulators, and therefore unadulterated results are attainable.

Among features in the case of the method are that it is provided to process a measured-value signal determined in analog form, the measured-value signal being supplied to a delta-sigma modulator, which makes a bit stream, particularly a one-bit data stream, available on the output side, in particular, whose average value or a moving average corresponds to the measured-value signal, the bit stream being supplied to a first digital filter that converts the bit stream into a stream of digital intermediate words, thus, a multibit data stream, the first digital filter having a number n of serially disposed accumulators, particularly integrators, where n is an integer and is equal to or greater than 1, in particular, is equal to or greater than 2, the bit stream being clocked with a clock frequency $f_S$, thus with a clock period $T_S=1/f_S$, and therefore the stream of digital intermediate words being clocked, and therefore updated, with clock frequency $f_S$, thus clock period $T_S=1/f_S$, the output signal of the first digital filter being supplied to a second digital filter, the second digital filter having the difference between a first and a second result data-word stream as output data-word stream, the first and second result data-word streams being determined from the intermediate data-word stream over a first and second time interval, the first and second time intervals being situated at a distance in time T1, the first result data-word stream being determined from the double of the intermediate data word belonging to the first instant, the intermediate data word located at distance in time $T_D$ prior to the first instant and the intermediate data word located at distance in time $T_D$ after the first instant being subtracted, the second result data-word stream being determined from the double of the intermediate data word belonging to the second instant, the intermediate data word located at distance in time $T_D$ prior to the second instant and the intermediate data word located at distance in time $T_D$ after the second instant being subtracted.

The advantage here is that three accumulators with downstream differential of second order are already sufficient to achieve a high-quality digital signal.

Example embodiments provide the further advantage that the calculation steps for determining the output data-word stream of the second digital filter, thus, the formation of the difference between a first and a second result data-word stream, are executable in overlapping fashion. Thus, the data rate on the output side may be further increased by parallel calculations overlapping in time, thus, by forming such differences.

In example embodiments, T1 is greater than or equal to the double of $T_D$. This offers the advantage that a low-pass filtering is attainable.

In example embodiments, clock period duration $T_D$ is an integral multiple of $T_S$. The advantage in this case is that a realization in hardware is easily practicable.

In example embodiments, the first digital filter is made up of three integrators or accumulators disposed directly one after the other. The advantage here is that a simple digital low-pass filtering is able to be produced.

In example embodiments, the moving average of the bit stream corresponds to the measured-value signal. Thus, the measured value is able to be represented with high accuracy if a large time interval is taken as a basis for the moving average.

In example embodiments, the clock signal used in the delta-sigma modulator is applied to the clock input of the first digital filter. This offers the advantage that a simple implementation is feasible.

Among features with respect to the method for determining an output current of a converter are that the measuring signals, acquired by a sensor and corresponding to the output current, are supplied to a respective processing channel, within which a method described above is carried out. Advantageously, improved current sensing is thus practicable in the case of converters, as well.

Among features with regard to the device for carrying out a method indicated above are that the sensor is disposed, together with the delta-sigma modulator, at the power electronics, particularly in a shared housing with the power electronics, and the digital filter is disposed at the signal electronics, particularly in a shared housing together with the signal electronics.

In example embodiments, the filter is spatially separate from the delta-sigma modulator.

In example embodiments, the delta-sigma modulator and the filter are disposed so as to be galvanically isolated, in particular, the signals being transmitted inductively or with the aid of optical fibers.

List of Reference Characters $T_S=1/f_S$ Clock period
$T_D=1/f_D$ Clock period
T1 Distance in time
M Three-phase motor
D Difference
1 Power electronics with output stage
2 Current sensing
3 Signal electronics for generating the PWM control signals for switches of the output stage
4 One-bit data line Example embodiments of the present invention are explained in greater detail with reference to the Figures.

DETAILED DESCRIPTION

Figure 1:
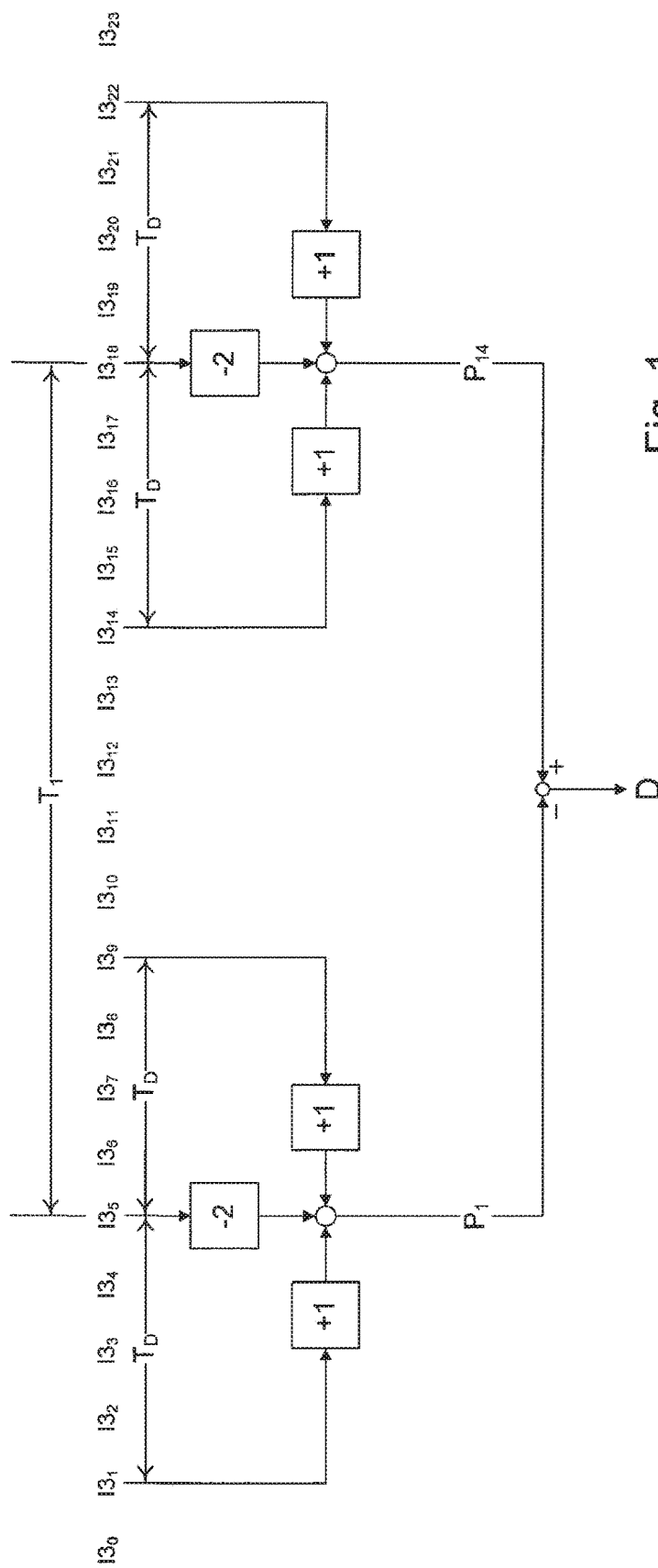
FIG. 1 illustrates the method according to an example embodiment of the present invention.
Figure 2:
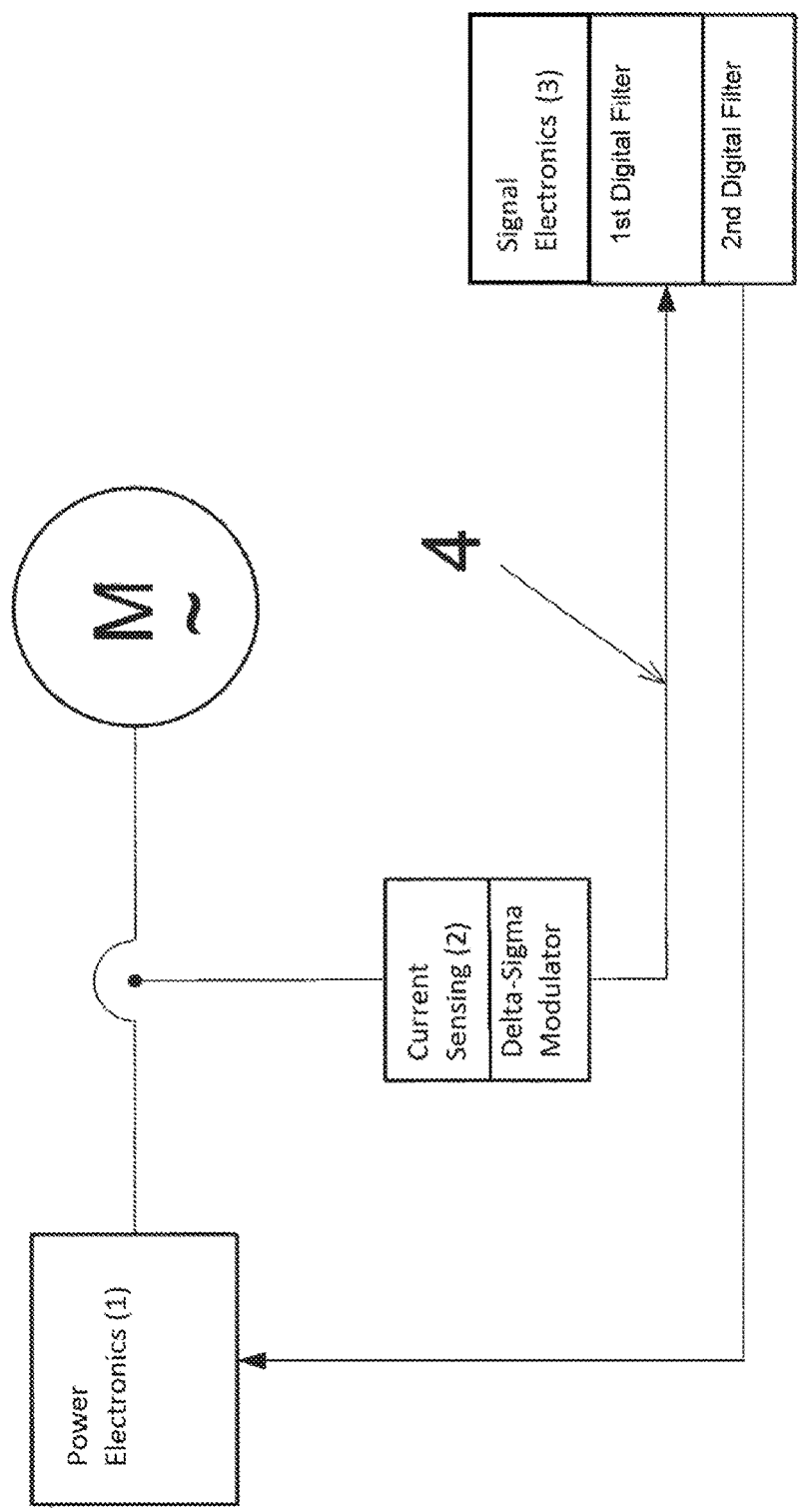
FIG. 2 shows a producible configuration according to an example embodiment of the present invention.

A three-phase motor M is energized from a converter, the converter making a three-phase voltage available with the aid of its power electronics 1, so that the speed of the motor is controllable.

Power electronics 1 are implemented with an output stage that includes three half-bridges of semiconductor switches, the switches receiving pulse-width-modulated control signals from signal electronics 3, or corresponding information being furnished by signal electronics 3 to a driver stage, included in power electronics 1, which then generates corresponding pulse-width-modulated signals and supplies them to the switches.

The signal electronics are situated in an area that is set off spatially from the area of the power electronics. For example, the power electronics are disposed in a first housing and the signal electronics are disposed in a second housing, the first and second housings being situated in different spatial areas.

Devices for sensing the motor current are also situated in the area of the power electronics, preferably in the housing of the power electronics, or directly joined to the housing of the power electronics. Given the three-phase realization of the three-phase current, the sensing of two phase currents of the three-phase motor is sufficient. Preferably, the devices include at least one shunt resistor. It is situated either in one of the half-bridges of the output stage of the converter, or in the lead from which the three half-bridges are supplied. In the last-named case, the current assigned to a respective half-bridge is able to be sensed as a function of the point in time, since in the case of converter-energized three-phase motors, in each instance, only one of the switches of a respective half-bridge is enabled as a function of time.

Device 2 for sensing the motor current also includes at least one delta-sigma modulator. Thus, each measured value acquired in respect to a motor phase is able to be supplied to a respective processing channel, including a delta-sigma modulator. Since the delta-sigma modulator supplies a bit stream, thus, a one-bit data stream, on the output side, the acquired value, converted from an analog to a digital representation, is able to be forwarded easily and without great expenditure to spatially remote signal electronics 3. Signal electronics 3 use the detected currents to determine the voltage values to be adjusted on the output side of the converter and the associated pulse-width-modulation ratio, respectively.

The transmission of the digital one-bit data stream to the signal electronics is made possible especially easily in galvanically isolated manner, thus, for example, via optical fiber or transformer. In so doing, the transmission is carried out using a Manchester-code data-transmission process. In this connection, the actual output signal of the delta-sigma modulator is combined with a higher-frequency clock signal, e.g., XOR, thus, exclusive-OR combined, and this combined signal is transmitted. For example, the higher-frequency clock signal has half the period duration as the sampling clock signal of the delta-sigma modulator. The decoding on the receive side may be accomplished easily and without special expenditure. In this manner, the signal is transmittable without difficulty, especially in noise-free fashion, over large spatial distances. In so doing, a line-conducted, differential, serial data channel may be used, which includes an electrical isolation. Alternatively, a radio transmission or an optical-fiber transmission may be used, as well. A non-differential data transmission is also sufficient for shorter distances.

Thus, one especially important advantage is that the respective one-bit data stream is also transmittable without interference over long distances, since it is carried out digitally.

In signal electronics 3, the transmitted signal, received and decoded again into the one-bit data stream, is supplied to a digital filter, the filter being included in the signal electronics. The filter has three integrators connected in series, the output signal of this series connection being subjected to a special data-processing method.

Preferably, the filter is likewise implemented digitally and needs multibit data streams, that preferably are realized with the aid of parallel multibit data buses, between the individual components of the filter. Transmitting such multibit data streams over large distances would require too much effort and is not necessary in the case of the present invention. In addition, the components of the filter are realizable with the aid of a computer, such as a microcontroller or the like. For example, this computer is also usable for the computation steps of the control process active in the converter, thus, for instance, for the computation steps of a field-oriented, closed-loop control of the electric motor. Thus, it is possible to dispense with an additional computer otherwise necessary.

In this manner, the filter, sophisticated from the standpoint of technical computations, is disposed in the signal electronics, in particular, components of the signal electronics thus also being effective as components of the filter.

The one-bit data stream of each processing channel has the information about the measured value of the supplied signal as time average.

FIG. 1 shows a portion of a filter according to an example embodiment of the present invention, downstream of the delta-sigma modulator, for one respective processing channel.

As also in the case of DE 10 2005 005 024, three integrators, which are also denotable as accumulators or integrating elements and are not shown in FIG. 1, and which are also included by the filter and are operated with a clock frequency $f_S$, thus clock period $T_S=1/f_S$, are disposed serially one after the other, so that an intermediate data-word stream is output at this serial configuration. In contrast to DE 10 2005 005 024, in which the intermediate data-word stream is supplied to the three following, again serially disposed differentiators, which, however, are operated with the much slower clock frequency $f_D$, thus, clock period $T_D=1/f_D$, a special data-processing method is carried out.

This special data processing is illustrated in FIG. 1.

In this context, it is important that the intermediate data-word stream be updated in the clock pulse of clock period $T_S$, thus, in the sampling clock of the delta-sigma modulator.

From this intermediate data stream, a time-discrete differential of the second order is determined by adding a first intermediate data word at a first instant to an intermediate data word at a distance $2 \times T_D$ away in time, and from the sum thus formed, subtracting the double value of the intermediate data word lying centrally in time between these two intermediate data words. Thus, a first result value is formed.

In order to form a second result value, the same operation is performed at a time interval lying at the distance in time $T_1$ from the first intermediate data word indicated. Thus, added to an intermediate data word at that place is again an intermediate data word at a distance $2 \times T_D$ away in time, and from the sum thus formed, the double value of the intermediate data word lying centrally between these two intermediate data words is subtracted, the centrally lying intermediate data word having the distance in time $T_1$ to the centrally lying intermediate data word utilized for calculating the first result value. Thus, a second result value is formed.

Difference D between the two result values is made available on the output side and represents the filtered measured value in digital form, a high accuracy being achievable in the process.

In contrast to DE 10 2005 005 024, neither any differentiators nor an output-side decimation filter OSR2 are necessary, since according to the method described herein, the result on the output side is determined directly by the difference between the first and second result.

A special advantage hereof is also that T1 is an arbitrary integral multiple of $T_S$, no further specification having to be made. Naturally, in this context, T1 is advantageously greater than the double of $T_D$, thus, T1>$T_D$. Since, for example, $1/T_S$ amounts to several MHz, thus, for instance, more than 10 MHz, T1 is alterable in fine steps.

Consequently, T1 is alterable with high time resolution during the operating time, and synchronizations to different clocked signal streams are therefore practicable without special expenditure. If, for example, the measured value of the signals of a resolver processed according to example embodiments of the present invention is supplied to control electronics of a converter, it is therefore possible in easy manner to carry out a synchronization to a clock pulse predefined by a field bus connected to the converter. To that end, only the value of T1 must thus be changed, which is practicable with the high time resolution of $T_S$.

In further exemplary embodiments of the present invention, instead of the second time-discrete differential, a time-discrete differential of the first, second, third or higher order is used, if the number of integrators, thus, accumulators, is changed correspondingly. Thus, if n integrators are provided, in order to form the first and second result value, in each case an n-tuple of intermediate data words $f_k$ set apart form each other at regular intervals with distance in time $T_D$ is used, where k runs from 0 to n−1. In this context, the differential is formed by forming the sum $$\sum_{k=0}^{n-1}(-1)^k\binom{n-1}{k}f_k$$

where summation index k runs from 0 to n−1.

Figure 3:
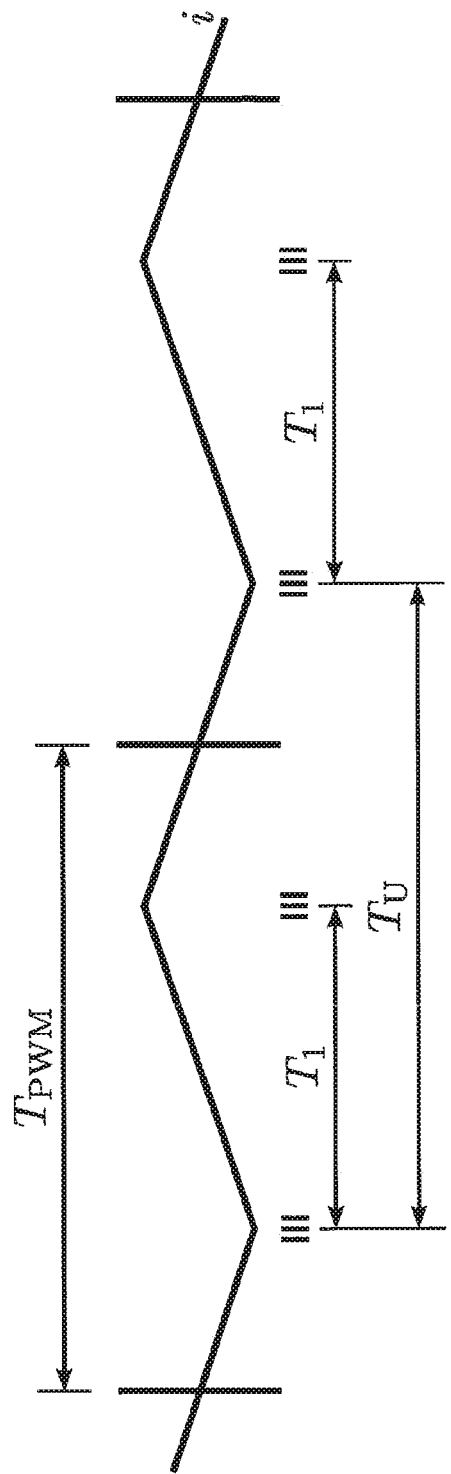
FIG. 3 illustrates the method according to an example embodiment of the present invention.

FIG. 3 shows, by way of example, an example embodiment in which the method is used to sense the output current "i" of a converter, which is operated with pulse-width modulation. In this case, for example, measuring duration T1 is intended to extend over one half PWM period duration. Consequently, T1 is able to be set very exactly with the high time resolution of $T_S$ according to the measuring duration desired.

In FIG. 3, the instants which are used for determining the differentials of second order are in each case represented by a set of three small bars. Each set of three has a time length of $2 \times T_D$. However, since $T_D$ is very much greater than $T_S$, a representation of distance in time $T_S$ is no longer possible in FIG. 3.

In addition, one measurement is to be performed in each PWM period. Consequently, $T_U$ is specified according to PWM period duration $T_{PWM}$, independently of T1. This may likewise be done with the high time resolution of $T_S$. Even if, for instance, $T_{PWM}$ is not an integral multiple of $T_S$, the time deviation therefrom in specifying $T_U$ remains very slight owing to the use of the method described herein.

What is claimed is:

1. A device for processing a measured-value signal representing a value, determined in analog form, for an output current of a converter, comprising:
a sensor;
at least one delta-sigma modulator; and
first and second digital filters; wherein:
the sensor (a) acquires the measured-value signal and (b) supplies the measured-value signal to the at least one delta-sigma modulator;
the at least one delta-sigma modulator supplies a bit stream to the first digital filter;
the first digital filter (a) converts the bit stream into a stream of digital intermediate words and (b) supplies an output signal to the second digital filter, wherein the first digital filter includes a number of serially disposed accumulators, the bit stream and the stream of digital intermediate words being clocked with a clock frequency $f_S$ and a clock period $T_S=1/f_S$;
the second digital filter determines a difference between a first and a second result data-word stream such that the difference is output as output data-word stream;
the first and second result data-word streams are determined from the intermediate data-word stream over a first and a second time interval, the first and second time intervals having time duration T1;
the first result data-word stream is determined from the intermediate data-word stream as a time-discrete differential of the order (n −1), with time duration $T_D$;
the second result data-word stream is determined from the intermediate data-word stream as a time-discrete differential of the order (n−1), with time duration $T_D$; and
T1 is equal to or greater than the double of $T_D$.

2. The device according to claim 1, wherein the bit stream includes a one-bit data stream.

3. The device according to claim 1, wherein the stream of digital intermediate words is a multi-bit data stream.

4. The device according to claim 1, wherein the accumulators include integrators.

5. The device according to claim 1, wherein the first digital filter includes 3 serially disposed accumulators.

6. The device according to claim 1, wherein the output data stream is transmitted to the first and/or second digital filter according to a Manchester code process, the first and/or second digital filter being spatially separate from the delta-sigma modulator.

7. The device according to claim 1, wherein at least one of (a) a respective measured-value signal is supplied to a delta-sigma modulator, which makes a bit stream available on the output side, and (b) at least one of (i) digital data and (ii) a one-bit output data stream from the delta-sigma modulator, is transmitted as a simple one-bit binary signal, without additional transmission of a clock signal and/or in the Manchester code.

8. The device according to claim 1, wherein the output data stream from the delta-sigma modulator is supplied to at least one of (a) the first and/or second digital filter and (b) the first and/or second digital filter spatially separate from the delta-sigma modulator.

9. The device according to claim 1, wherein the clock period duration $T_D$ is an integral multiple of $T_S$.

10. The device according to claim 1, wherein the first digital filter includes three integrators or accumulators disposed directly one after another.

11. The device according to claim 1, wherein a moving average of the bit stream corresponds to the measured-value signal.

12. The device according to claim 1, wherein the clock signal used in the delta-sigma modulator is separated on the filter side and is applied to the clock input of the first digital filter.

13. The device according to claim 1, the first digital filter having n number of serially disposed accumulators, where n is an integer and is equal to or greater than 2.

14. The device according to claim 1, wherein the sensor and the delta-sigma modulator are disposed in at least one of (a) power electronics and (b) a shared housing with power electronics, and the at least one digital filter is disposed in at least one of (a) signal electronics and (b) a shared housing with signal electronics.

15. The device according to claim 14, wherein the at least one digital filter is spatially separate from the delta-sigma modulator.

16. The device according to claim 14, wherein the delta-sigma modulator and the filter are disposed so as to be galvanically isolated, the signals being transmitted at least one of (a) inductively and (b) with the aid of optical fibers.

17. The device according to claim 1, wherein the sensor and the delta-sigma modulator are disposed in at least one of (a) power electronics and (b) a shared housing with power electronics, and the first and/or second digital filter is disposed in at least one of (a) signal electronics and (b) a shared housing together with signal electronics.

* * * * *